(12) United States Patent
Srinivasan et al.

(10) Patent No.: US 8,079,656 B2
(45) Date of Patent: Dec. 20, 2011

(54) METHOD FOR DECIMATION OF IMAGES

(75) Inventors: Uma Srinivasan, Mountain View, CA (US); Stephen David White, Santa Clara, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 1397 days.

(21) Appl. No.: 11/644,238

(22) Filed: Dec. 22, 2006

(65) Prior Publication Data

US 2008/0150972 A1    Jun. 26, 2008

(51) Int. Cl.
B41J 29/38 (2006.01)
G06K 9/36 (2006.01)
G06F 17/17 (2006.01)

(52) U.S. Cl. .................. 347/5; 347/9; 382/290; 708/313

(58) Field of Classification Search .................. 347/5, 9; 382/290; 708/313
See application file for complete search history.

(56) References Cited

U.S. PATENT DOCUMENTS

| | | | |
|---|---|---|---|
| 6,247,787 B1 | 6/2001 | Giere et al. | |
| 6,678,390 B1 * | 1/2004 | Honsinger | 382/100 |
| 6,890,050 B2 | 5/2005 | Ready et al. | |
| 6,972,261 B2 | 12/2005 | Wong et al. | |
| 2007/0127085 A1 * | 6/2007 | Mori | 358/403 |

OTHER PUBLICATIONS

Gao, Fuquan, Ain A. Sonin, Precise Deposition of Molten Microdrops: The Physics of Digital Microfabrication, Proceedings: Mathematical and Physical Sciences, vol. 444, No. 1922 (Mar. 8, 1994), The Royal Society.
Schiaffino, Stefano and Ain A. Sonin, Molten Droplet Deposition and Soldification at Low Weber Numbers, Phys. Fluids p. 3172, Nov. 1997 American Institute of Physics.
Schiaffino, Stefano and Ain A. Sonin, Formation and Stability of Liquid and Molten Beads on a Solid Surface, J. Fluid Mech. (1997) vol. 343, pp. 95-110, 1997 Cambridge University Press.

* cited by examiner

Primary Examiner — Matthew Luu
Assistant Examiner — Jannelle M Lebron
(74) Attorney, Agent, or Firm — Fay Sharpe LLP

(57) ABSTRACT

In the case of printing at high addressability, where the cell size is smaller than the spot size, an image can be decimated in a manner that will limit the large accumulation of printed material. The proper decimation of the image will depend on the spot size, the physics of drop coalescence and the addressability during printing. A simple method of using concentric decimation is disclosed herein to enable this process.

8 Claims, 13 Drawing Sheets

METHOD FOR DECIMATION OF IMAGES

BACKGROUND

The exemplary embodiment relates generally to image processing systems and, more particularly, to a method of decimating images.

A printed circuit board, or PCB, is a self-contained module of interconnected electronic components found in devices ranging from common beepers, or pagers, and radios to sophisticated radar and computer systems. The circuits are generally formed by a thin layer of conducting material deposited, or "printed," on the surface of an insulating board known as the substrate. Individual electronic components are placed on the surface of the substrate and soldered to the interconnecting circuits. Contact fingers along one or more edges of the substrate act as connectors to other PCBs or to external electrical devices such as on-off switches. A printed circuit board may have circuits that perform a single function, such as a signal amplifier, or multiple functions.

Two other types of circuit assemblies are related to the printed circuit board. An integrated circuit, sometimes called an IC or microchip, performs similar functions to a printed circuit board except the IC contains many more circuits and components that are electrochemically "grown" in place on the surface of a very small chip of silicon. A hybrid circuit, as the name implies, looks like a printed circuit board, but contains some components that are grown onto the surface of the substrate rather than being placed on the surface and soldered.

Ink-jet printing of circuits is an emerging technology that attempts to reduce the costs associated with production by replacing expensive lithographic processes with simple printing operations. By printing a pattern directly on a substrate rather than using the delicate and time-consuming lithography processes used in conventional manufacturing, a printing system can significantly reduce production costs. The printed pattern can either comprise actual features (i.e., elements that will be incorporated into the final circuit, such as the gates and source and drain regions of thin film transistors, signal lines, opto-electronic device components, etc.) or it can be a mask for subsequent semiconductor or printed circuit board processing (e.g., etch, implant, etc.).

Ink-jet printing of circuits is an emerging technology that attempts to reduce the costs associated with production by replacing expensive lithographic processes with simple printing operations. By printing a pattern directly on a substrate rather than using the delicate and time-consuming lithography processes used in conventional manufacturing, a printing system can significantly reduce production costs. The printed pattern can either comprise actual circuit features (i.e., elements that will be incorporated into the final circuit, such as the gates and source and drain regions of thin film transistors, signal lines, opto-electronic device components, etc.) or it can be a mask for subsequent semiconductor processing (e.g., etch, implant, etc.).

Several forms of printing etch masks exist. One example is that of a printed wax pattern used as a copper etch mask for creating PCBs. Another example is laser direct imaging (LDI), a maskless lithography method that is currently being used for copper etch masks on PCBs. It uses a laser to write the raster image of the pattern directly on the photoresist. In order for it to be to be cost-effective, it is necessary to have special high speed resists. Also, there is no suitable method for soldermask patterning using laser.

Typically, circuit printing involves depositing a print solution (generally an organic material) by raster bitmap along a single axis (the "print travel axis") across a solid substrate. Print heads, and in particular, the arrangements of the ejectors incorporated in those print heads, are optimized for printing along this print travel axis. Printing of a pattern takes place in a raster fashion, with the print head making "printing passes" across the substrate as the ejector(s) in the print head dispense individual droplets of print solution onto the substrate. At the end of each printing pass, the print head makes a perpendicular shift relative to the print travel axis before beginning a new printing pass. The print head continues making printing passes across the substrate in this manner until the pattern has been fully printed.

The physical properties of the printed drops on the substrate govern the drop coalescence and therefore on the quality of the printed features. When a molten drop at temperature $T_o$ is ejected from the print head onto the substrate, the solidification time is given by $$\tau_1 = \frac{2a^2 k}{3\alpha k_a}\left(\ln\left(\frac{T_o - T_a}{T_f - T_a}\right) + \left(1 + \frac{k_s}{2k}\right)\frac{L}{c(T_f - T_a)}\right)$$

where $T_a$ is the ambient temperature, $T_f$ is the fusion temperature, $\alpha$ and $k$ are the thermal diffusivity and the thermal conductivity, respectively of the molten drop and $k_s$ is the thermal conductivity of the substrate, L is the latent heat of fusion and c is the specific heat of the molten drop.

It takes additional time for the drop to cool down to the ambient temperature and the time scale for this process is given by:

$$\tau_2 = \frac{2.3 a^2 k}{3\alpha k_a}$$

The dynamics of the drop spreading on the substrate is primarily governed by the Weber number $W_e$ and the Ohnesorge number Z:

$$W_e = \frac{\rho V^2 a}{\sigma}$$

$$Z = \frac{\mu}{\sqrt{\rho \sigma a}}$$

where $\mu$ is viscosity, $\rho$ is density, $\sigma$ is surface tension, V is impact velocity and a is the radius of the drop.

The Weber number $W_e$ scales the driving force for the drop spreading and the Ohnesorge number Z scales the force that resists the spreading. While impact and capillarity are the main forces for drop spreading, inertia and viscosity are the main factors that resist the drop spreading.

The time scales of the drop spreading and solidification indicate that the bulk of the drop solidifies only after the spreading is complete. However, local solidification of the drop occurs prior to the completion of the drop spreading and this determines the shape of the printed drop. The local solidification occurs at the contact line between the drop and the substrate and arrests further spreading of the drop.

When drops are ejected at a frequency f, the time between subsequent drops reaching the substrate is $$\tau = \frac{1}{f}$$

and the distance between the centers of the subsequent drops on the substrate is $$l = \frac{u}{f}.$$

Drop coalescence between adjacent drops occur when $l \leq 2a$ and $\tau \leq \tau_1$.

Once dispensed from the ejector(s) of the print head, print solution droplets attach themselves to the substrate through a wetting action and proceed to solidify in place. The size and profile of the deposited material is guided by competing processes of solidification and wetting. In the case of printing phase-change materials for etch mask production, solidification occurs when the printed drop loses its thermal energy to the substrate and reverts to a solid form. In another case, colloidal suspensions such as organic polymers and suspensions of electronic material in a solvent or carrier are printed and wet to the substrate leaving a printed feature. The thermal conditions and material properties of the print solution and substrate, along with the ambient atmospheric conditions, determine the specific rate at which the deposited print solution transforms from a liquid to a solid.

Photolithography is not an additive process, and so the problem of printed material accumulation may not arise even at high addressability. In the case of jet printing, images are typically printed at low addressability (~600 DPI), where large accumulation of the printed material is not a major issue. Even in the case of moderately high addressability (~1200 DPI), techniques like halftoning are used. However, this will not give an accurate representation of micro-scale features.

Thus, digital lithography with drop-on-demand technologies is becoming popular since it is cost-effective for low volume applications. Phase change materials like wax can be jet printed and used as a masking layer to pattern micro-scale features. Spot placement accuracy is extremely important for semiconductor/PCB fabrication processes. Failure to have good spot placement accuracy can result in patterning defects, which can reduce the yield and lead to inconsistent device performance. It is therefore necessary to print at high addressability for digital lithography applications so that high spot placement accuracy can be obtained.

When rasterization of the image is done at high addressability and then printed, there is a large three-dimensional accumulation of the material that is printed, which destroys the features that are obtained. Three dimensional accumulation especially takes place when molten droplets are ejected at high addressability onto solidified wax at ambient temperature. This is very common while printing with multiple passes.

The exemplary embodiment contemplates a new and improved method that resolves the above-referenced difficulties and others.

INCORPORATION BY REFERENCE

The following references, the disclosures of which are incorporated herein in their entireties by reference, are mentioned:

U.S. Pat. No. 6,972,261, issued Dec. 6, 2005 to Wong et al., entitled "METHOD FOR FABRICATING FINE FEATURES BY JET-PRINTING AND SURFACE TREATMENT," describes a method of forming smaller features by jet-printing with materials from aqueous or non-aqueous organic solutions.

U.S. Pat. No. 6,890,050, issued May 10, 2005 to Ready et al., entitled "METHOD FOR THE PRINTING OF HOMOGENEOUS ELECTRONIC MATERIAL WITH A MULTI-EJECTOR PRINT HEAD," describes a system and method for accurately printing IC patterns and allows the printed features to be optimized for edge profile and electrical continuity.

BRIEF DESCRIPTION

In the case of printing at high addressability, where the cell size is smaller than the printed spot size, an image can be decimated in a manner that will limit the large accumulation of printed material. The proper decimation of the image will depend on the spot size, the physics of material coalescence and the addressability during printing. A simple method of using concentric decimation is disclosed herein to enable this process.

In one embodiment, a method of decimating an image having one or more features is provided. The method comprises: making an image with concentric outlines of the features; and applying a masking filter that depends on the physical characteristics of the printed material.

In another embodiment, a method of decimating an image having one or more features is provided. The method comprises: making an image with one or more concentric outer outlines and a halftone inner fill of the features; and applying masking filters for the concentric outlines and halftone fill based on the physical characteristics of the printed material.

In yet another embodiment, a method of decimating a raster image having one or more features is provided. The method comprises: skeletonizing the desired features of the image by M pixels to form an outline; leaving one pixel of the skeletonized outline as black and the inner area filled as white; and continuing until the entire image is done based on the radius of the spot size while retaining every $N^{th}$ pixel of the remaining lines and removing the rest.

In yet another embodiment, a method of decimating a raster image having one or more features is provided. The method comprises: separating the features into outer and inner fill components; skeletonizing the outer component of the image by M pixels; leaving one pixel of the skeletonized outline as black and the inner area filled as white and continuing until the desired concentric outer outlines are complete; retaining every $N^{th}$ pixel of the concentric outer outlines and removing the rest; changing the inner fill component to a halftone pattern; combining the concentric outer outlines and halftone inner fill; and separating the image into vertical and horizontal components using a convolution process.

In yet another embodiment, a method of decimating a vector image having one or more features is provided. The method comprises: contracting the desired features of the vector image based on desired print cell size and spot size, leaving a border vector, and continuing until the entire image is done; rasterizing the vector image; and retaining every $N^{th}$ pixel of the remaining features and removing the rest, where N is based on the cell size and the spot size.

DETAILED DESCRIPTION

Figure 1:
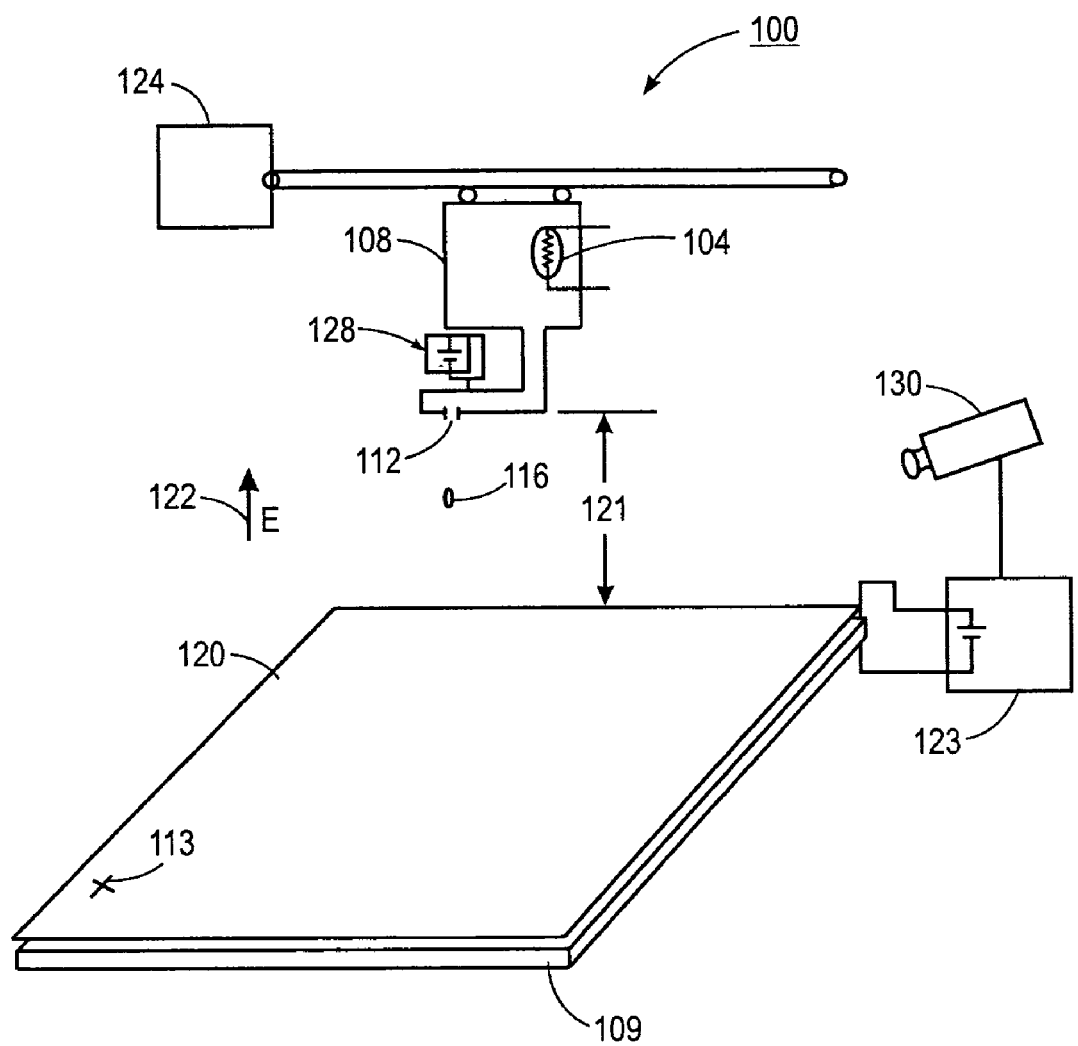
FIG. 1 is a perspective view of a printing system suitable for IC printing.

Some portions of the detailed description that follows are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems will be apparent from the description below. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

FIG. 1 is a perspective view of a printing system 100 suitable for IC and PCB printing. Note that while the embodiments disclosed herein are described with respect to IC and PCB printing for explanatory purposes, these embodiments can be applied to any situation in which homogenous, smooth-walled features in a digital lithography pattern is required.

FIG. 1 includes a heat source 104 that heats a reservoir 108 of typically phase-change material to a temperature that is sufficient to maintain the material in a liquid state. The system 100 is suitable for creating a pattern, typically using a printer to controllably eject individual droplets to form a patterned protective layer or coating over regions of the substrate to define the outline and fill regions of the desired feature(s). Regions that were not at one time covered by protective layer will be subject to deposition (or removal) of materials used to form various features. Thus, feature size will not be limited by droplet size, but instead by how closely droplet spots can be positioned together without combining to form a joined feature. Generally, the temperature of the reservoir 108 is maintained above 100 degrees C. and in some embodiments, at temperatures above 140 degrees C., a temperature sufficient to liquify most phase change organics.

The phase-change material may be an organic media that melts at low temperatures. Other desirable characteristics of the phase-change material include that the patterning material is non-reactive with organic and inorganic materials used in typical semiconductor materials processing, and that the phase change material has a high selectivity to etchants. If liquid suspension is used, the substrate material is maintained above the boiling point of the liquid, and after deposition of the patterning material, the liquid carrier evaporates upon contact with the substrate surface. When evaporation is used, the phase change process is directed from liquid to vapor, rather than from liquid to solid.

An additional desirable characteristic of the phase-change patterning material is that the resulting pattern should be robust enough to withstand wet-chemical or dry etching processes. Wax is an example of a phase-change material for both these processes. Kemamide 180-based waxes from Xerox Corporation of Stamford Conn. is but one example of a suitable wax for use as a phase-change patterning material.

One or more droplet sources 112 such as a print head receives the liquid phase-change marking material from the reservoir 108 and outputs droplets 116 for deposition on a substrate 120. Typical substrate 120 materials are silicon, glass, and printed circuits boards. The substrate 120 is maintained at a temperature such that the droplet cools rapidly after deposition. A wetting agent, typically a dielectric material such as silicon dioxide, $SiO_2$ or silicon nitride, $Si_3N_4$, may be included on the surface to enhance wetting thereby assuring that sufficient wetting occurs to form a good contact between the pattern and the substrate. The temperature of the system is maintained such that the cooling rate is sufficient to control the behavior of the droplet after contacting the substrate 120 despite the enhanced wetting properties of the surface to be etched.

When increased coalescence between adjacent printed droplets is required, the substrate temperature can be increased to increase droplet spreading and thereby increase coalescence. When printing lines of Kemamide-based wax from an acoustic ink-jet printer, it has been found that increasing the substrate temperature from 30 degrees to 40 degrees C. improves the print quality of the pattern. In the case of Kemamide-based waxes, it has been found that excellent results are achieved when the surface is maintained at 40 degrees centigrade, which is about 20 degrees C. below the freezing point of the wax. At 40 degrees C., the temperature of the substrate is still low enough that the droplet rapidly "freezes" upon contacting substrate 120.

In order to minimize the possibility of partial midair freezing of droplets in the space 121 between the droplet source 112 and the substrate 120, an electric field 122 may be applied to accelerate the droplet from the droplet source 112 to the substrate 120. The electric field 122 may be generated by applying a voltage, typically between one to three kilovolts between the droplet source 112 and an electrode or platen 109 under the substrate 120. For this voltage, the space 121 between the print head and the substrate should be held to a corresponding typical range of 0.5-1.0 mm. The electric field 122 minimizes droplet transit time through the space 121 and allows substrate surface temperature to be the primary factor controlling the phase change operation. Moreover, the increased droplet velocity in the space 121 improves the directionality of the droplet allowing for improved straight-line features.

After a droplet of marking material is deposited on the substrate 120, the relative positions of the substrate and the droplet source are adjusted to reposition the droplet source over a second position to be patterned. The repositioning operation may be achieved either by moving the droplet source 112 or by moving the substrate 120. A control circuit 124 establishes relative motion between the droplet source 112 and the substrate 120 in a predetermined pattern. A driver circuit 128 provides energy to the droplet source 112 causing ejection of droplets when the droplet source 112 is positioned opposite a region of the substrate 120 to be patterned. By coordinating the movement of the droplet source 112 with the timing of droplet source outputs, a pattern can be "printed" on the substrate 120.

As each spot is printed, a feedback system may be used to assure spots of proper size. An imaging system, such as a camera 130, may be used to monitor spot size. When smaller features are to be printed, or the spot size otherwise reduced, a temperature control circuit 123 lowers the temperature of a surface of the substrate 120. The lower temperature increases the quench rate resulting in rapid solidification of the phase change patterning material upon contact with the substrate 120. When larger spots are needed, usually for merging spots to form larger features, the temperature control circuit 123 raises the temperature of the substrate 120. The temperature control circuit 123 may include a heating element thermally coupled to the substrate 120 such that ambient heating of media around the substrate is minimized.

Generally, the phase change material is a solid at temperatures below approximately 60 degrees C. As such, it may be unnecessary to cool the substrate below room temperature because, as previously described, a sufficiently small droplet cools rapidly when a 20 degree temperature differential is maintained between the freezing point of the phase change material and the substrate temperature. In such cases, the temperature control circuit may merely be a sensor and a heater that raises the substrate slightly above room temperature when larger feature sizes are to be printed.

In order to control and align the movement of the droplet source 112, printed alignment marks, such as a mark 113, patterned from a previous patterned layer may be used to coordinate the next overlying layer. An image processing system such as the previously described camera may be used to capture the orientation of the previous patterned layer. A processing system then adjusts the position of the overlying pattern layer by altering the pattern image file before actual printing of the pattern layer Each droplet source may be implemented using a variety of technologies including traditional ink-jet technology and the use of sound waves to cause ejection of droplets of patterning material as done in acoustic ink printing systems.

To obtain the desired pattern results from the printing system 100, the layout data must be appropriately processed, the print head 112 must be properly configured, and the print head 112 must be accurately aligned and calibrated with respect to the substrate 120.

Figure 2:
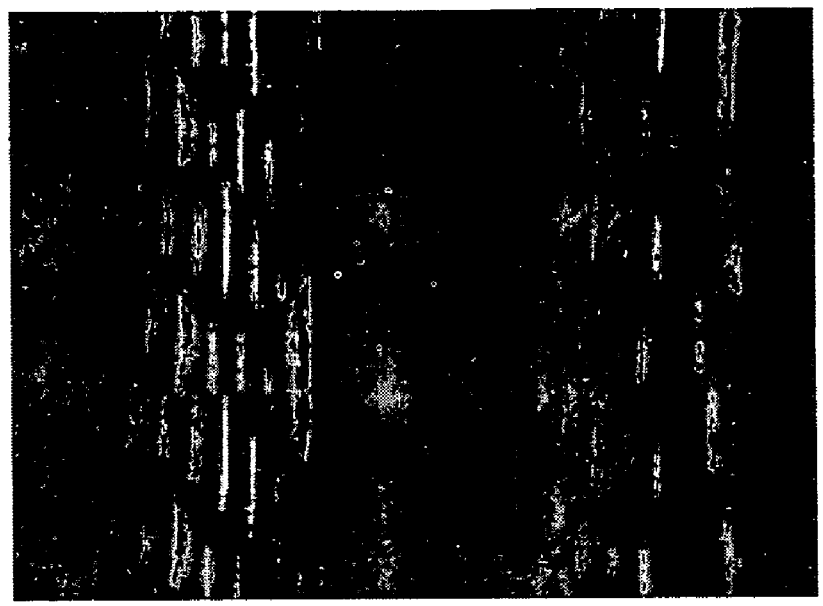
FIG. 2 illustrates a printed area filled at high addressability showing large accumulation of printed material.
Figure 3:
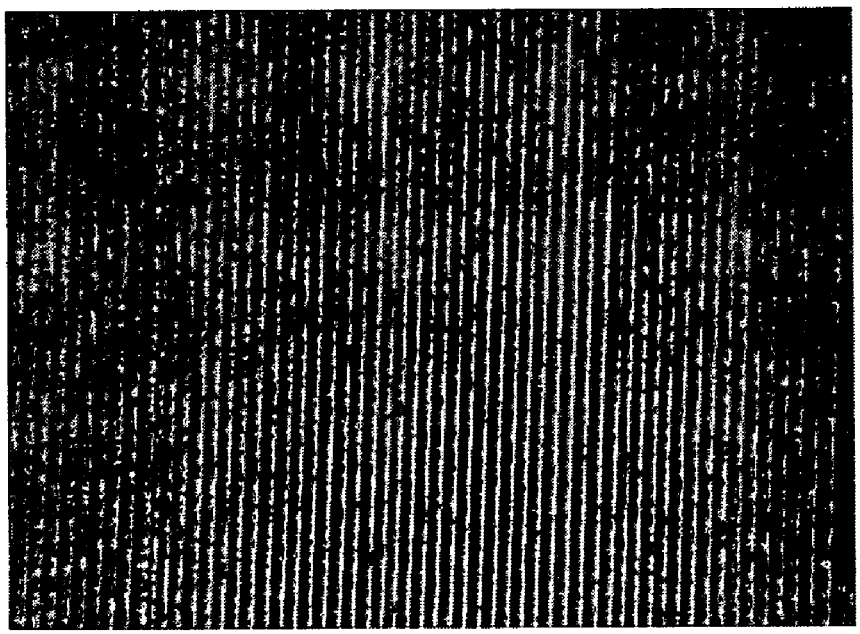
FIG. 3 illustrates a printed area filled at 600 DPI showing good coverage.
Figure 4:
FIG. 4 illustrates an image printed at high addressability without appropriate decimation.

In a typical printing process, the cell size/addressability is comparable to the spot size, thus resulting in good reproduction of the images. In the case of semiconductor fabrication processes, good spot placement accuracy (~5 um) is desired. In order to obtain this, it is necessary to print at high addressability (4800 DPI corresponding to ~5 um cell size), especially if the print head has unevenly spaced ejectors. When the cell size is much smaller than the spot size (e.g., cell size ~5 um and spot size ~50 um), a large accumulation of the printed material will be observed as shown in FIG. 2. (Some regions in the figure are out of focus due to the uneven height of the printed material.) Printing at a resolution (DPI) with a cell size corresponding to the spot size should yield the best results, as shown in FIG. 3. An image printed at high addressability can cause a large build-up of material such that they are three-dimensional leaning features, as shown in FIG. 4, which may fall at any time.

Corrections to the image must be applied so that the features will be reproduced well when printed at high addressability. It should be noted that Optical Proximity Correction (OPC) is routinely used in the optical lithography process. OPC is the process of modifying the polygons that are drawn by the designers to compensate for the non-ideal properties of the lithography process. Given the shapes desired on the wafer, the mask is modified to improve the reproduction of the critical geometry. The addition of OPC features to the mask layout allows for tighter design rules and significantly improves process reliability and yield. In a similar manner, digital lithography using jet printing also requires material coalescence correction in order to reproduce the features accurately. The vertical and horizontal masks that may be used as correction to the image depends on the material coalescence, which in turn depends on several physical parameters like the frequency of printing, surface tension, viscosity, temperature, etc.

Figure 5:
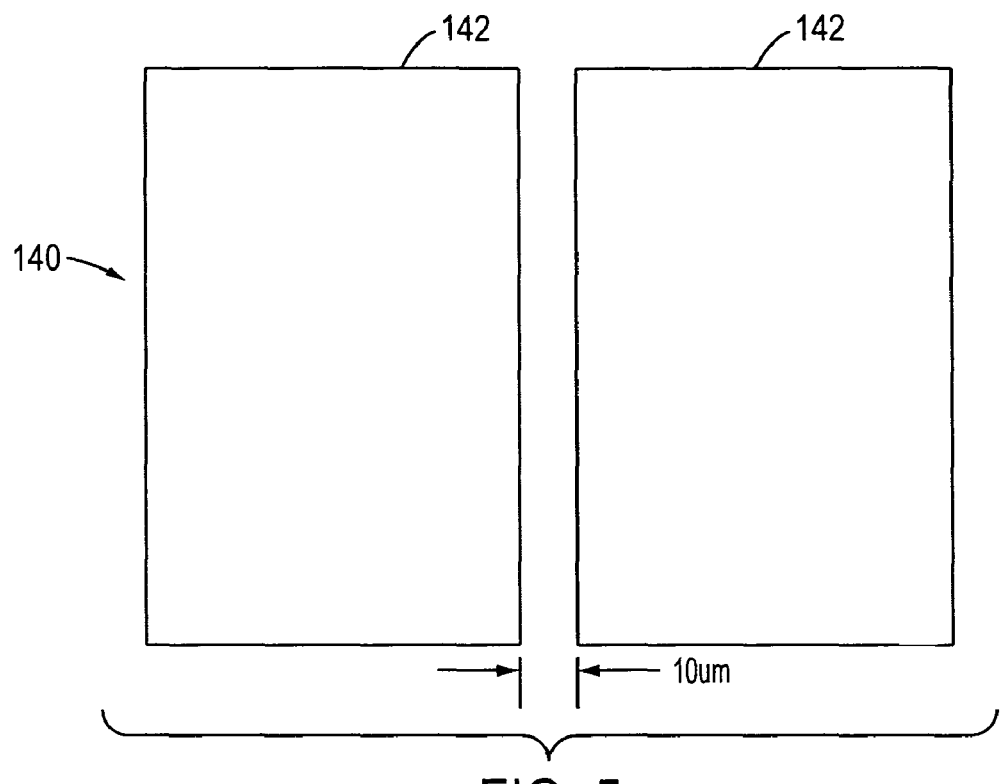
FIG. 5 is a block diagram illustrating a desired pattern with fine gaps.
Figure 6:
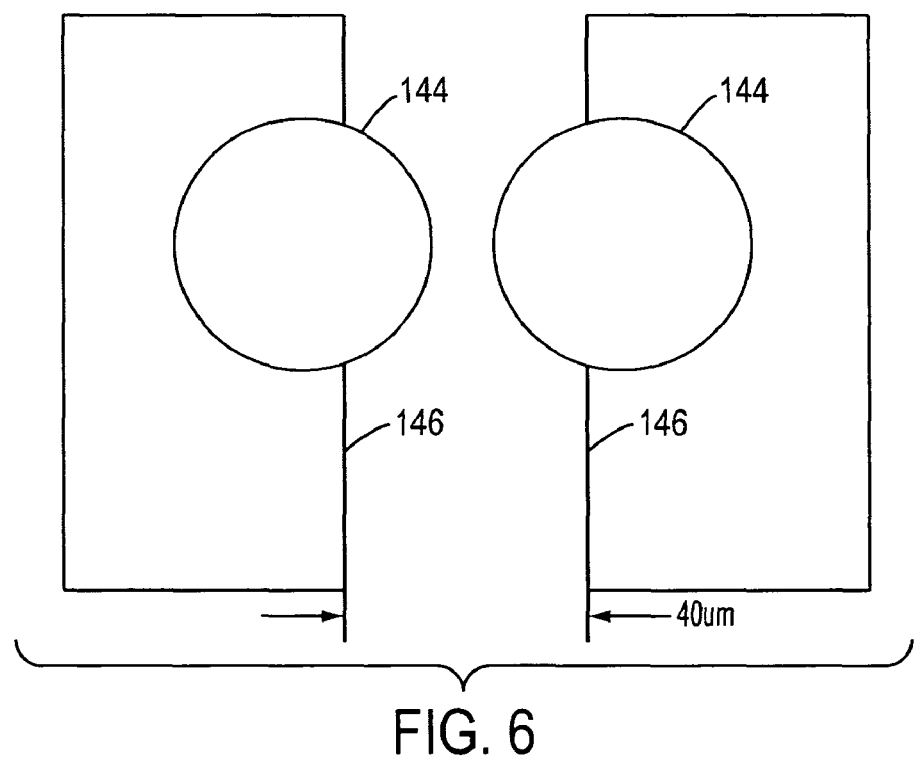
FIG. 6 is a block diagram illustrating spot placement of large drops necessary to achieve the appropriate fine gaps shown in FIG. 5.
Figure 7:
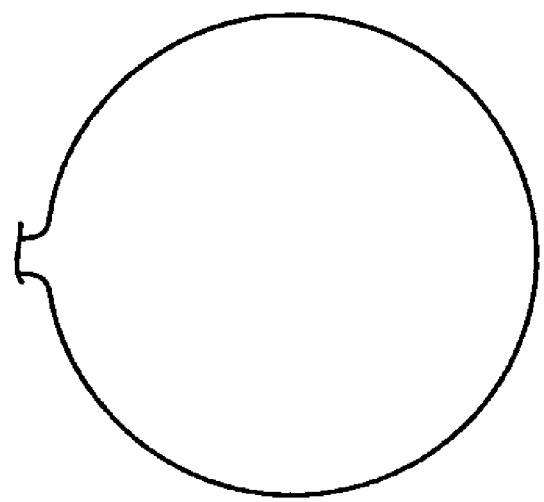
FIG. 7 illustrates a vector image to be printed.
Figure 8:
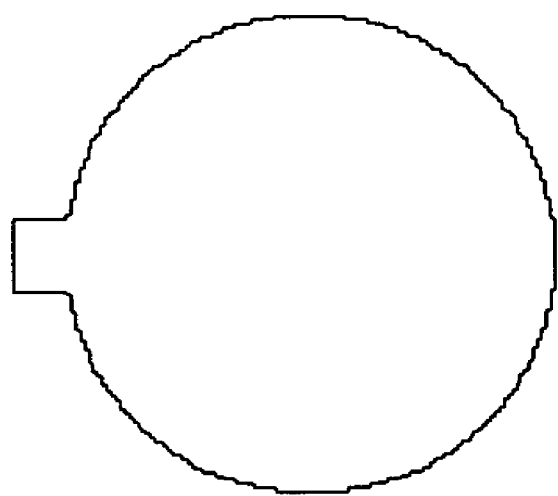
FIG. 8 illustrates typical 4800 dpi rasterization of the vector image of FIG. 7.
Figure 9:
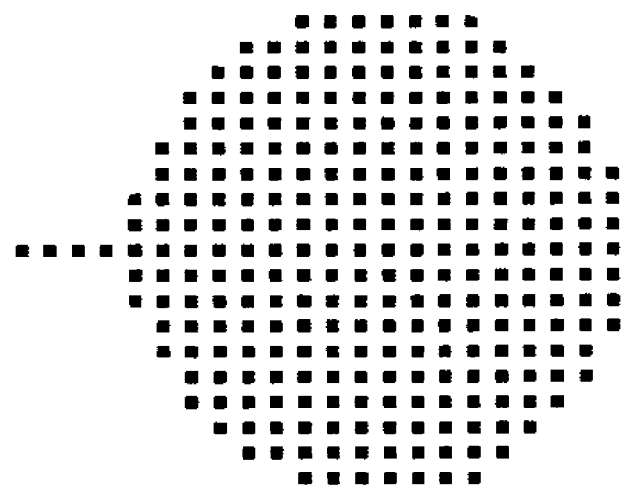
FIG. 9 illustrates simple decimation of the rasterized image of FIG. 8.
Figure 10:
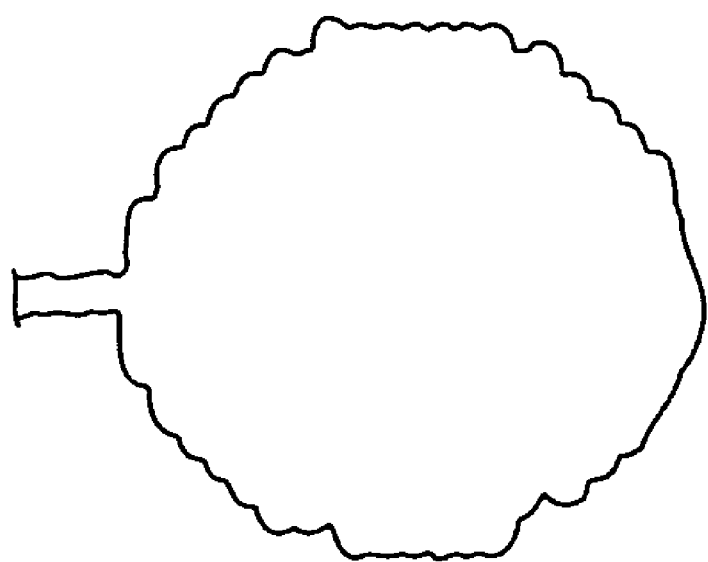
FIG. 10 illustrates the image printed in FIG. 7 with simple decimation at 4800 DPI.
Figure 11:
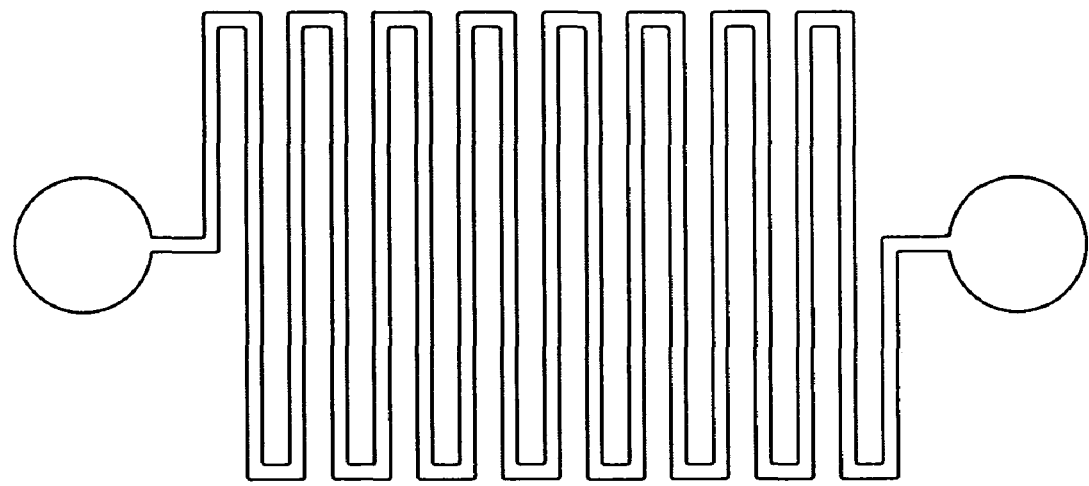
FIG. 11 illustrates a vector image to be printed.
Figure 12:
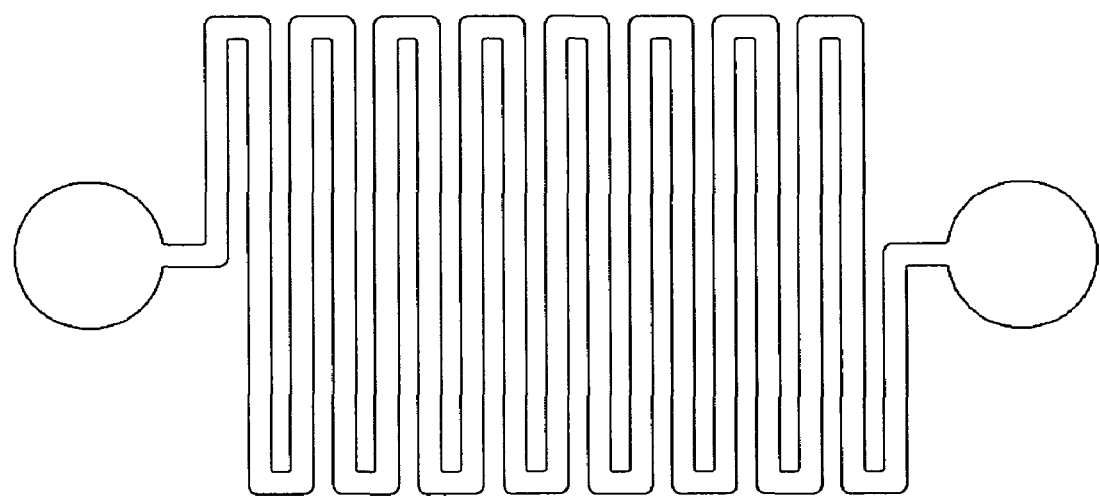
FIG. 12 illustrates typical 4800 dpi rasterization of the vector image of FIG. 11.
Figure 13:
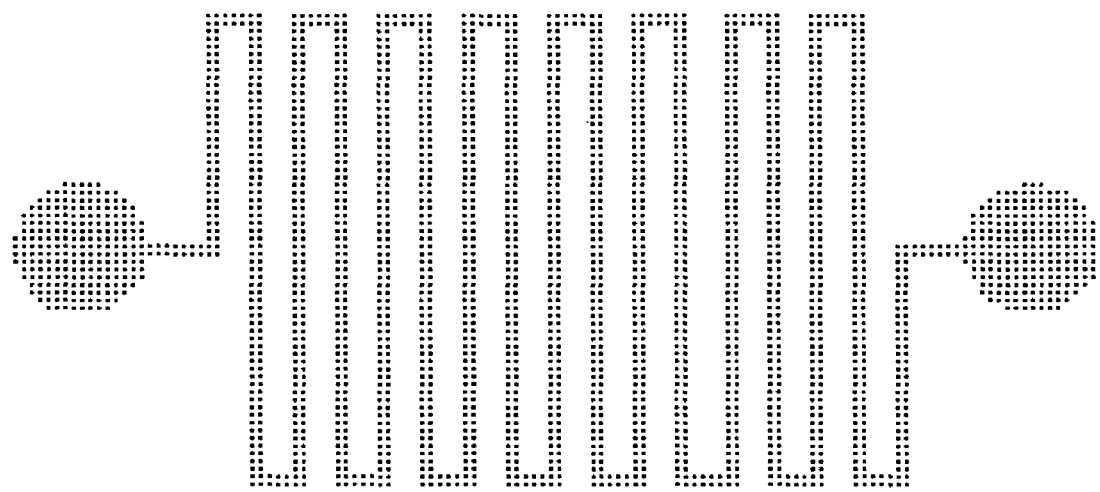
FIG. 13 illustrates simple decimation of the rasterized image of FIG. 12 showing uneven feature dimensions.
Figure 14:
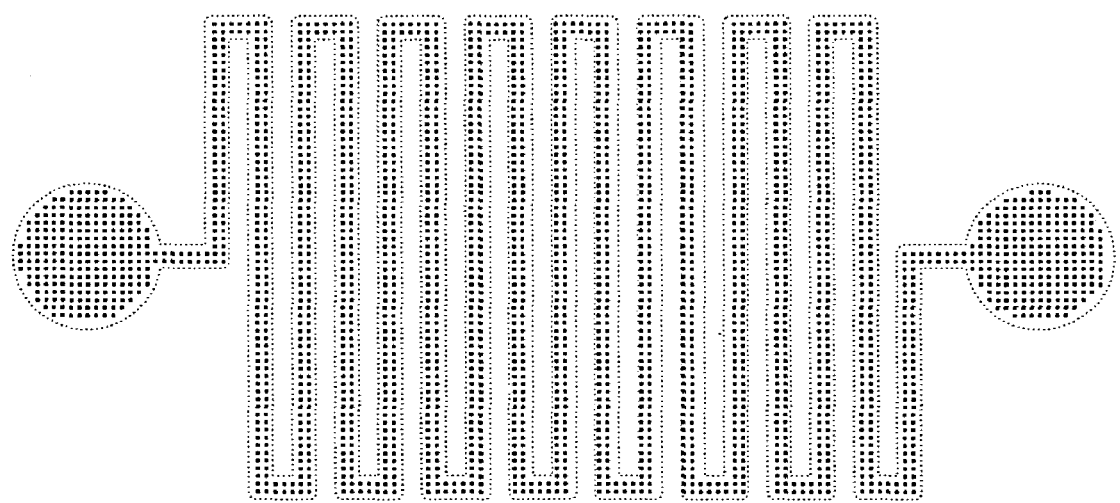
FIG. 14 illustrates incorrect decimation of the rasterized image of FIG. 12 showing uneven fills that can create voids.

FIG. 5 shows a desired pattern 140 with alternate lines 142, while FIG. 6 shows a diagram of printed spots 144 forming a set of alternate lines 146 in the rasterized image. Thus, a suitable placement of spots 144 is necessary to achieve the appropriate fine gaps as shown in FIG. 5. For example, in the case of alternate lines of 10 μm width and a spot radius of ~40 μm, a 40 μm gap in the rasterized image is necessary for obtaining a 10 μm gap in printed image—even under ideal conditions. In other words, for a desired gap g, the rasterized image should have a gap of 2*r+c+g, where r is the radius and c is the cell size. A reduction in the spot size combined with higher addressability is one solution to getting finer gaps with closely spaced fine features FIG. 7 shows a vector circle, and FIG. 8 shows the same circle rasterized at 4800 DPI. In comparison to this, it can be noted from FIGS. 9 and 10 that a decimated circle loses the smoothness. This is due to the fact that only a simple decimation was used. In decimation, a new value is calculated from a neighborhood of samples and replaces these values in the minimized image. FIGS. 11, 12, and 13 show a serpentine pattern that is at first a vector image, has then been rasterized and then finally decimated at 4800 DPI, respectively. Again, the simple decimation causes uneven feature dimensions and spacing, which are not desirable. FIG. 14 shows another method of decimation where a simple decimation is used in the fill area and the outlines are decimated in a different fashion. This causes uniform linewidths, but it also introduces voids, which are not desirable.

Figure 15:
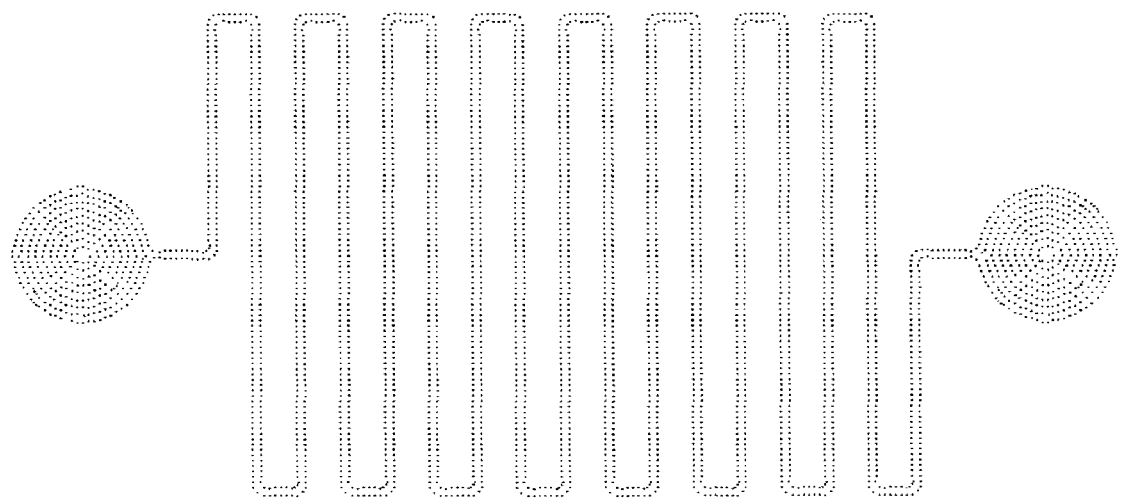
FIG. 15 illustrates concentric decimation of the rasterized image of FIG. 11 showing homogenous feature dimensions and good fill.
Figure 16:
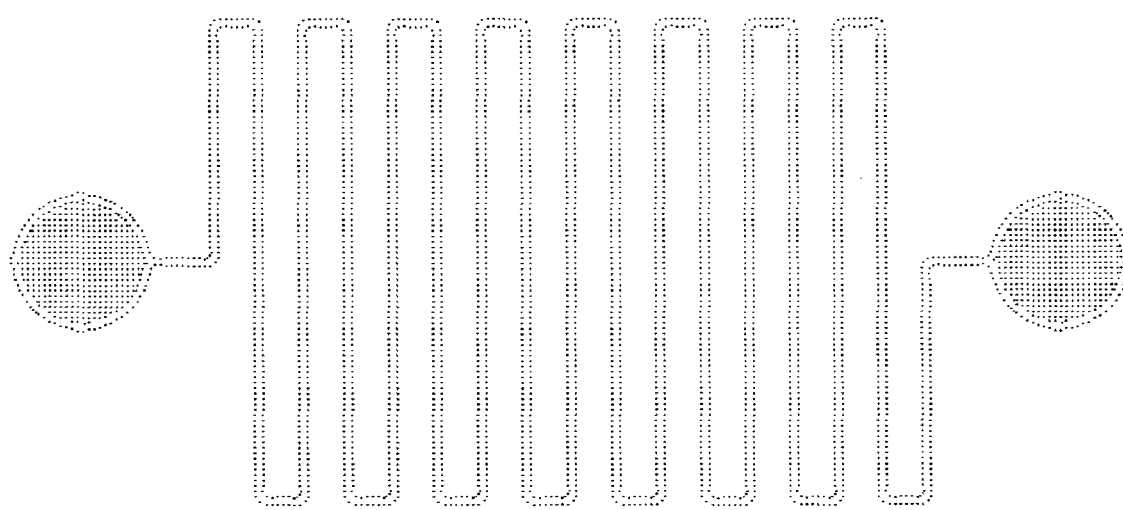
FIG. 16 shows concentric decimation of the outer region and halftone for the inner region of the rasterized image of FIG. 15.

FIG. 15 shows concentric decimation of the rasterized image of FIG. 11 with homogeneous line widths and good fill. FIG. 16 shows concentric decimation of the outer region and halftone for the inner region of the rasterized image of FIG. 11. In both cases, skeletonization of the image was involved. Briefly, skeletonization of images is a process for reducing foreground regions in an image to a skeletal remnant. This remnant largely preserves the extent and connectivity of the original region, while discarding most of the original foreground pixels. Skeletonization is typically performed in one of two ways. With one class of techniques, a morphological thinning is provided that successively erodes away pixels from the edges of each ridge line in such a way that no more thinning is possible and the medial line is left. What remains approximates the skeleton. With the other class of techniques, a distance transform of the image is calculated, with the skeleton lying along the singularities in the distance transform. In either case, the resulting skeletonized image may be processed to define points at which the lines end or bifurcate using methods known in the art.

Concentric decimation of a raster image having one or more features (square, line, circle, etc.) may be accomplished by performing the following basic operations:
 (a) Skeletonize the desired features of the raster image by M pixels based on the physical characteristics of the printed material (For example M=([spot radius]/[cell size]));
 (b) Leave 1 pixel of the skeletonized outline;
 (c) Continue (a) until the entire image is done; and
 (d) Retain every Nth pixel of the remaining features and remove the rest. Again, N is generally equal to M. A smaller number usually would give better feature edge smoothness, but when it is very low, accumulation of the printed material occurs and the features will not be smooth.

Concentric decimation may be accomplished in at least two formats: (1) concentric decimation with concentric outline and concentric inner fill, and (2) concentric decimation with concentric outer outlines and halftone inner fill. Each of these formats will be explained in greater detail below.

Figure 17:
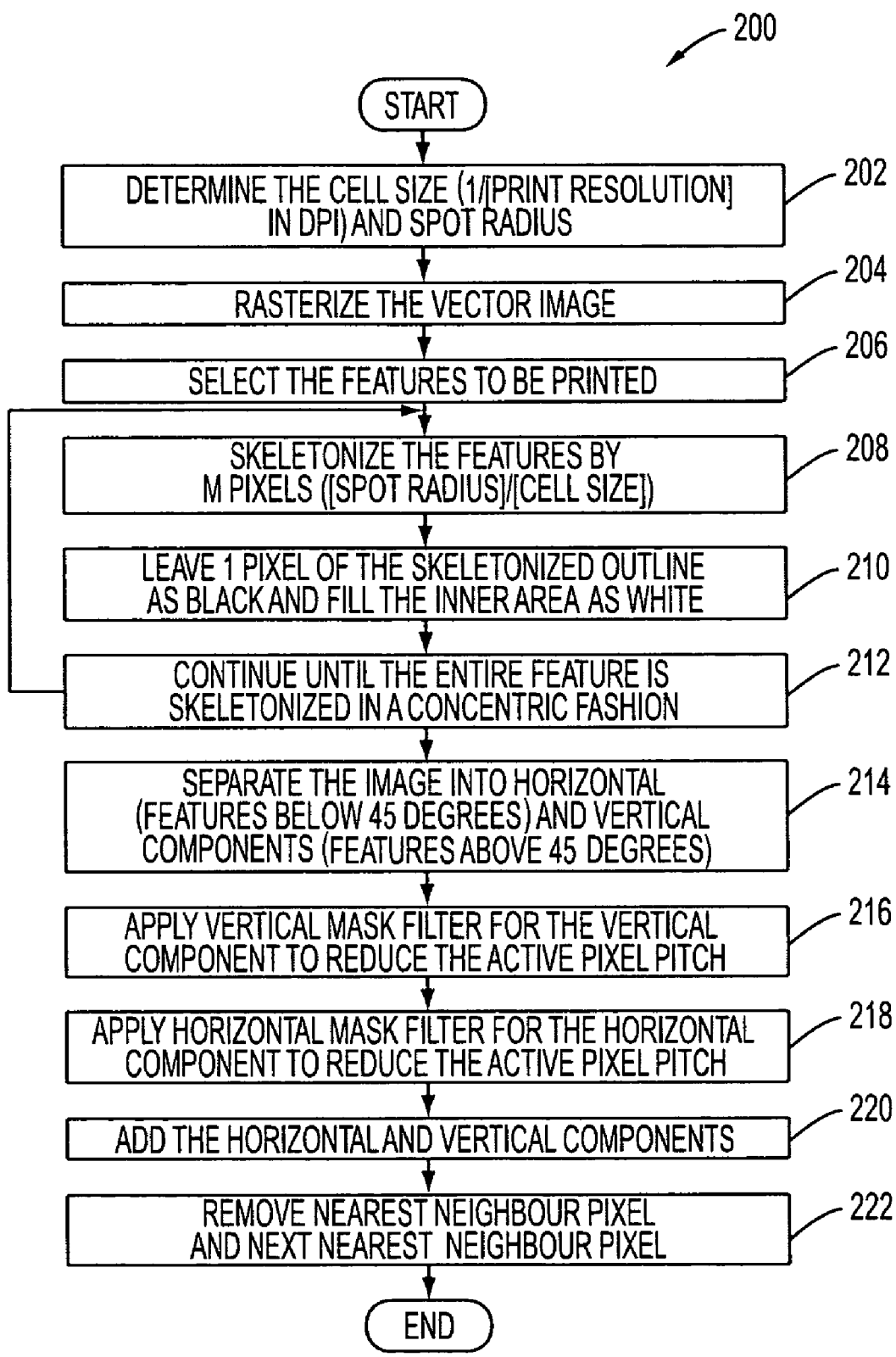
FIG. 17 shows a flowchart of a method of concentric decimation with concentric outline and concentric inner fill.

We turn now to FIG. 17, where a method (200) of concentric decimation with concentric outline and concentric inner fill is illustrated. Initially, the cell size (1/[print resolution] in dpi) and the spot radius are determined (202). The entire vector image is then rasterized (204). The features of the image that are to be printed are then selected (206).

Next, the features are skeletonized by M pixels ([spot radius]/[cell size]) (208). The integer M may be optimized for smoothness, controlling the accumulation of printed material, and/or accurate feature dimension replication. One pixel of the skeletonized outline is left as black and the inner area is filled as white (210). The last two steps are continued until the entire feature is decimated in a concentric fashion (212). Note that the skeletonization process may vary for different features of the image and in different regions of the features.

The rasterized image is then separated into horizontal (features below 45 degrees) and vertical components (features above 45 degrees) by using convolution (214). Convolution consists of the following operations:
 (a) Overlay the appropriate (i.e., horizontal or vertical) convolution mask on the image;
 (b) Multiply the coincident terms;
 (c) Sum all the results; and
 (d) Move to the next pixel, continuing across the entire rasterized image.

The convolution equation used to perform (a)-(c) is given by:

$$\sum_{x=-\infty}^{+\infty} \sum_{y=-\infty}^{+\infty} I(r-x, c-y) M(x, y), \quad (1)$$

where M(x,y) is the appropriate convolution mask and l(r,c) is the image.

Figure 18:
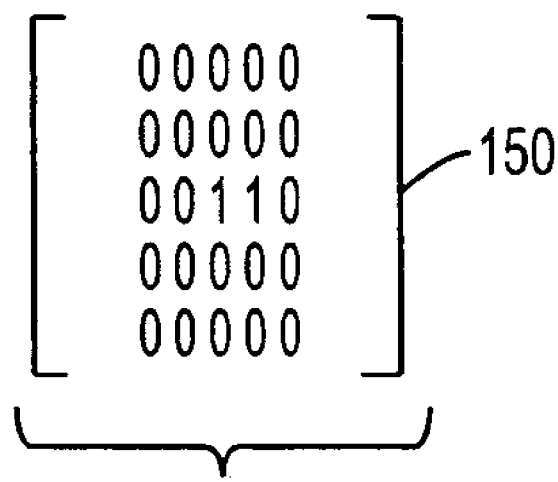
FIG. 18 shows a horizontal component convolution mask.
Figure 19:
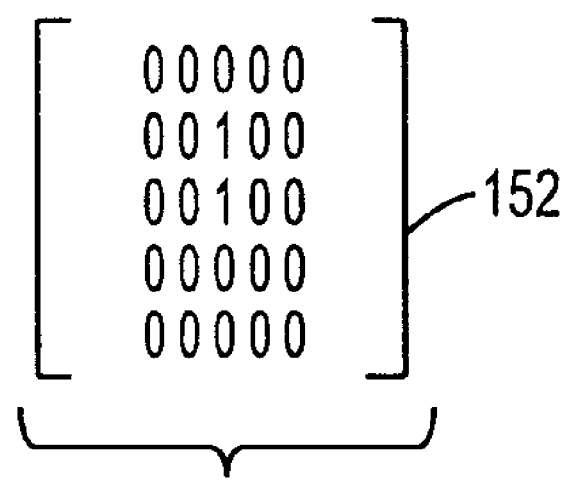
FIG. 19 shows a vertical component convolution mask.

An example of a horizontal component convolution mask 150 is shown in FIG. 18, while an example of a vertical component convolution mask 152 is shown in FIG. 19. These masks may be also be at different pitches and different angles.

Figure 20:
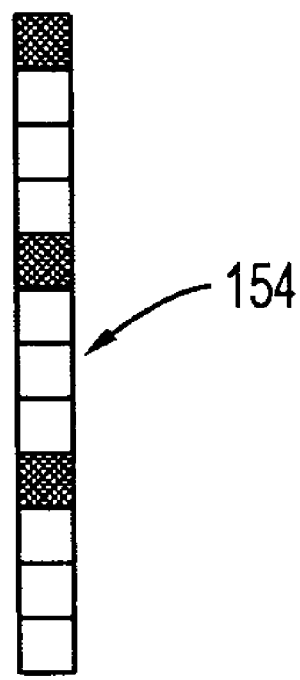
FIG. 20 shows a vertical mask filter.
Figure 21:
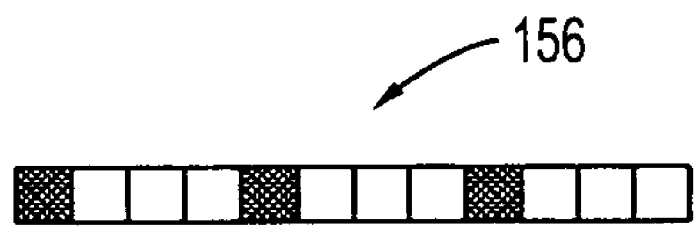
FIG. 21 shows a horizontal mask filter.

A vertical mask filter 154 (see FIG. 20) is applied for the vertical components to reduce the active pixel pitch (216). As shown in this example, every $4^{th}$ pixel is filled. A horizontal mask filter 156 (see FIG. 21) is applied for the horizontal components to reduce the active pixel pitch (218). Again, in this example, every 4$^{th}$ pixel is filled. The application of the masking filters may be optimized for smoothness, controlling the accumulation of printed material, and/or accurate feature dimension replication. Also note that the masking filters may vary for different features of the image and in different regions of the features.

The horizontal and vertical components are then added to obtain the decimated outline (220). Finally, some of the closely spaced pixels that are at the intersection between the horizontal and vertical components are removed (222).

Figure 22:
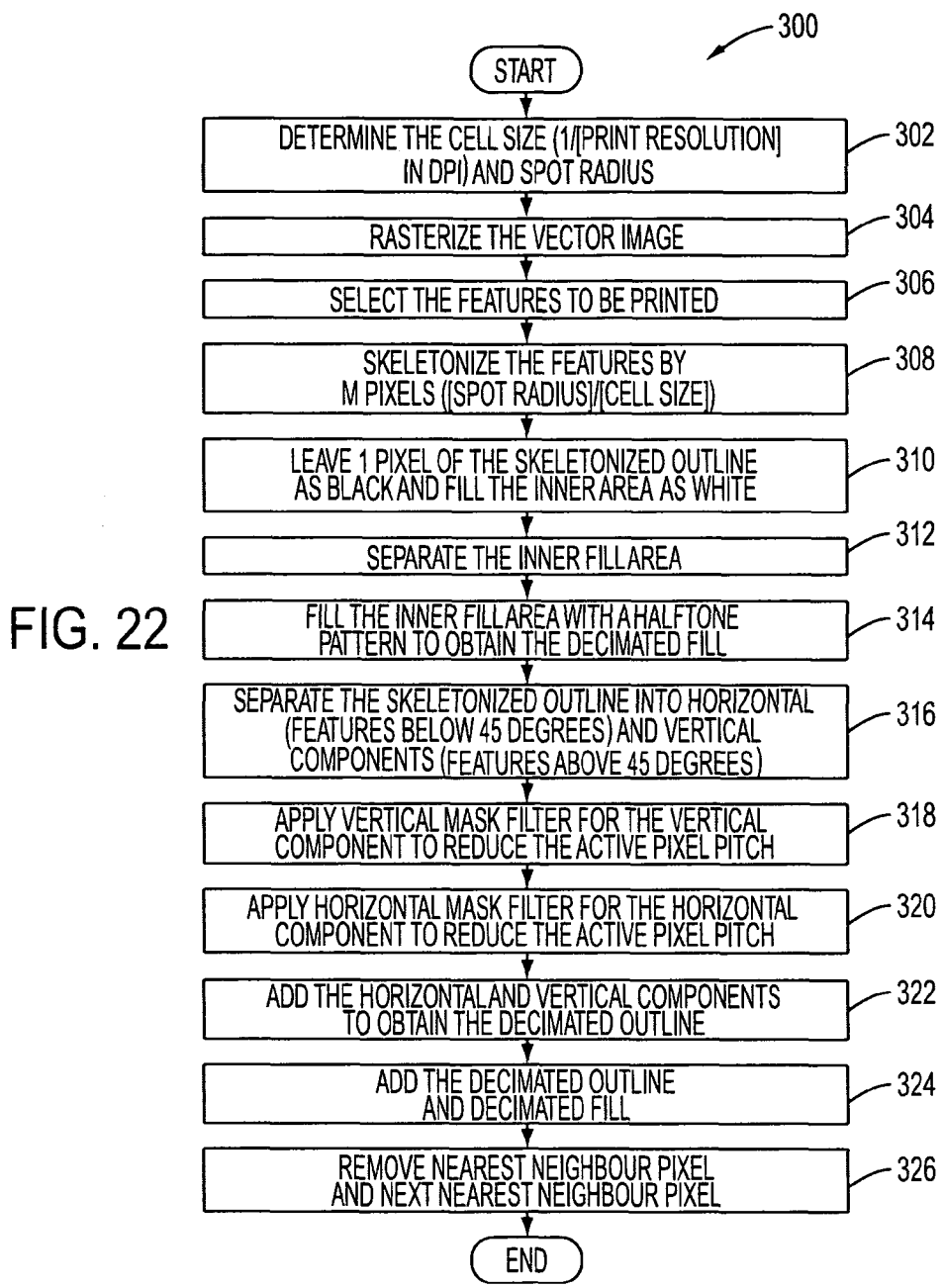
FIG. 22 shows a flowchart of a method of concentric decimation with concentric outline and halftone inner fill.

We turn now to FIG. 22, where a method (300) of concentric decimation with concentric outlines and halftone inner fill is illustrated. Once again, the cell size (11[print resolution] in dpi) and the spot radius must be determined first (302). The design layer is then rasterized (304). The features of the image that are to be printed are then selected (306).

Figure 23:
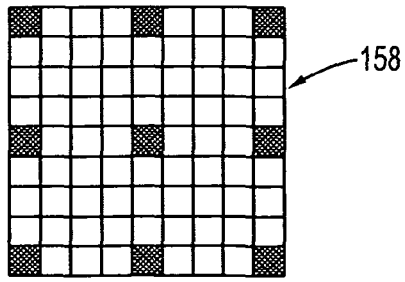
FIG. 23 shows an example of an inner fill halftone filter.

Next, the features are skeletonized by M pixels ([spot radius]/[cell size]) (308). Again, the integer M may be optimized for smoothness, controlling the accumulation of printed material, and/or accurate feature dimension replication. One pixel of the skeletonized outline is left as black and the inner area is filled as white (310). The last two steps are continued until the outer outlines are complete. Note that the skeletonization process may vary for different features of the image and in different regions of the features. The inner fill area is then separated (312) and filled with a halftone pattern 158 (see FIG. 23) to obtain the decimated fill (314). The halftone pattern can be at different pitch and at different angles. There may be one or more concentric outer outlines with each of them separated by M pixels. The inner fill area may overlap with the concentric outer outlines to ensure good coverage.

The skeletonized outline is then separated into horizontal (features below 45 degrees) and vertical components (features above 45 degrees) as described earlier (316). The vertical mask filter is applied for the vertical components to reduce the active pixel pitch (318). The horizontal mask filter is applied for the horizontal components to reduce the active pixel pitch (320). The application of the masks may be optimized for smoothness, controlling the accumulation of printed material, and/or accurate feature dimension replication. Also note that the masking filters may vary for different features of the image and indifferent regions of the features.

The horizontal and vertical components are then added to obtain the decimated outline (322). The decimated outline and decimated fill are added (324). Finally, the nearest neighbor pixel and the next nearest neighbor pixel are removed (326).

The methods mentioned so far are raster image processing techniques. Several hybrid combinations of vector and raster image processing methods may be used to create the concentric decimation. This may be useful to optimize the speed and memory requirement for the processing. For example, one of the methods would be to rasterize and decimate the boundary vectors. The vector bounded regions may then be contracted, with the rasterization and decimation applied to the new vectors. The process may be continued until the contracted regions are too small to rasterize further.

It will be appreciated that several of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A method of decimating a raster image comprised of a plurality of pixels and having one or more features, the method comprising:
   skeletonizing the desired features of the image by M pixels to form an outline;
   leaving one pixel of the skeletonized outline as black and the inner area filled as white;
   continuing in a concentric fashion until the entire image is done and retaining every N$^{th}$ pixel of the remaining outlines and removing the rest; and
   separting the image into vertical and horizontal components using a convolution process that includes overlaying a convolution mask on the image, multiplying the coincident terms, summing all the results, and repeating for each pixel across the entire image.

2. The method defined in claim 1, further comprising:
   applying a vertical mask filter for the vertical components to reduce the active pixel pitch; and
   applying a horizontal mask filter for the horizontal components to reduce the active pixel pitch.

3. The method defined in claim 2, further comprising:
   adding the horizontal and vertical components to obtain the decimated outline; and
   removing some of the closely spaced pixels at the intersection of the two components.

4. The method defined in claim 1, wherein the parameters M and N are optimized for edge smoothness, for the amount of accumulation of printed material, or for accurate feature dimension replication.

5. A method of decimating a raster image
   comprised of a plurality of pixels and having one or more features, the method comprising:
   skeletonizing the desired features of the image by M pixels to form an outline;
   leaving one pixel of the skeletonized outline as black and the inner area filled as white;
   continuing until the entire image is done and retaining every N$^{th}$ pixel of the remaining outlines and removing the rest; and
   separating the image into vertical and horizontal components using a convolution process, wherein the convolution process comprises:
   overlaying a convolution mask on the image;
   multiplying the coincident terms;
   summing all the results;
   repeating for each pixel across the entire image.

6. The method defined in claim 5, further comprising:
   applying a vertical mask filter for the vertical components to reduce the active pixel pitch; and
   applying a horizontal mask filter for the horizontal components to reduce the active pixel pitch.

7. The method defined in claim 6, further comprising:
   adding the horizontal and vertical components to obtain the decimated outline; and
   removing some of the closely spaced pixels at the intersection of the two components.

8. The method defined in claim 5, wherein the parameters M and N are optimized for edge smoothness, for the amount of accumulation of printed material, or for accurate feature dimension replication.

* * * * *